(12) United States Patent
Han et al.

(10) Patent No.: US 11,013,109 B2
(45) Date of Patent: May 18, 2021

(54) DISPLAY UNIT, ELECTRONIC APPARATUS INCLUDING THE SAME, AND METHOD OF MANUFACTURING THE ELECTRONIC APPARATUS

(71) Applicant: Samsung Display Co., Ltd., Yongin-si (KR)

(72) Inventors: Jung-Soo Han, Yongin-si (KR); Hwa-Su Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/601,706

(22) Filed: Oct. 15, 2019

(65) Prior Publication Data

US 2020/0178384 A1 Jun. 4, 2020

(30) Foreign Application Priority Data

Dec. 3, 2018 (KR) .................. 10-2018-0153325

(51) Int. Cl.
*H05K 1/02* (2006.01)
*H05K 1/09* (2006.01)
(Continued)

(52) U.S. Cl.
CPC .......... *H05K 1/028* (2013.01); *G02F 1/13452* (2013.01); *G09F 9/301* (2013.01);
(Continued)

(58) Field of Classification Search
CPC ........ H05K 1/02; H05K 1/0259; H05K 1/028; H05K 1/09; H05K 1/11; H05K 3/36;
(Continued)

(56) References Cited

U.S. PATENT DOCUMENTS 10,080,281 B2  9/2018 Jung et al.
2011/0299007 A1* 12/2011 Ra ................... G02F 1/13338
349/58

(Continued)

FOREIGN PATENT DOCUMENTS

KR  10-2006-0079694  7/2006
KR  10-1012803  2/2011
KR  10-2016-0092123  8/2016

OTHER PUBLICATIONS

Extended European Search Report dated Aug. 12, 2020, in European Patent Application No. 19210230.9.

*Primary Examiner* — Xiaoliang Chen
(74) *Attorney, Agent, or Firm* — H.C. Park & Associates, PLC

(57) ABSTRACT

A display unit includes a display panel, a circuit board bent from a front surface of the display panel toward a rear surface of the display panel, a window disposed on the front surface of the display panel to cover an active area, and a cover panel film disposed on the rear surface of the display panel and disposed between the display panel and the circuit board. The cover panel film includes a first portion overlapping with the display panel, and a second portion extending from the first portion to protrude from the display panel when viewed in a plan view. The second portion is disposed between the circuit board and the window when viewed in a cross-sectional view.

14 Claims, 18 Drawing Sheets

(51) Int. Cl.
*H05K 1/11* (2006.01)
*H05K 3/36* (2006.01)
*H05K 5/00* (2006.01)
*H05K 5/02* (2006.01)
*G02F 1/1333* (2006.01)
*G06F 3/041* (2006.01)
*G06F 3/14* (2006.01)
*H01L 27/32* (2006.01)
*H01L 51/00* (2006.01)
*H01L 51/52* (2006.01)
*G02F 1/1345* (2006.01)
*G09F 9/30* (2006.01)
*H05K 1/14* (2006.01)

(52) U.S. Cl.
CPC .......... *H01L 27/32* (2013.01); *H01L 51/0097* (2013.01); *H05K 1/147* (2013.01); *H05K 5/0017* (2013.01); *G02F 2201/50* (2013.01); *G02F 2202/28* (2013.01); *H05K 2201/10128* (2013.01)

(58) Field of Classification Search
CPC .......... H05K 5/00; H05K 5/02; H05K 5/0204; G02F 1/1333; G02F 1/13452; G02F 1/133305; G02F 1/133382; G06F 3/041; G06F 3/14; G06F 3/1446; H01L 27/32; H01L 27/3248; H01L 27/3258; H01L 27/3276; H01L 27/3293; H01L 51/00; H01L 51/52
USPC .......... 361/749, 220, 751; 345/173; 349/150
See application file for complete search history.

(56) References Cited

U.S. PATENT DOCUMENTS

| | | | |
|---|---|---|---|
| 2012/0176564 A1* | 7/2012 | Hatakeyama | G02F 1/1345 349/62 |
| 2014/0307396 A1* | 10/2014 | Lee | H05K 1/028 361/749 |
| 2015/0230331 A1* | 8/2015 | Lee | H05K 1/0259 361/220 |
| 2015/0316810 A1* | 11/2015 | Shibahara | G02F 1/133382 349/150 |
| 2016/0147361 A1* | 5/2016 | Ahn | G09G 3/20 345/173 |
| 2016/0219723 A1* | 7/2016 | Jung | H05K 1/147 |
| 2016/0358989 A1* | 12/2016 | Kwon | H01L 29/78675 |
| 2017/0083273 A1* | 3/2017 | Kim | G09G 3/3406 |
| 2017/0118852 A1* | 4/2017 | Kim | F16M 13/02 |
| 2017/0154947 A1* | 6/2017 | Nakamura | H01L 51/5284 |
| 2019/0157589 A1* | 5/2019 | Kim | H01L 27/3276 |

\* cited by examiner

DISPLAY UNIT, ELECTRONIC APPARATUS INCLUDING THE SAME, AND METHOD OF MANUFACTURING THE ELECTRONIC APPARATUS

CROSS-REFERENCE TO RELATED APPLICATION

This application claims priority to and the benefit of Korean Patent Application No. 10-2018-0153325, filed Dec. 3, 2018, which is hereby incorporated by reference for all purposes as if fully set forth herein.

BACKGROUND

Field

The present disclosure herein relates to a display unit, an electronic apparatus including the same, and a method of manufacturing the electronic apparatus, and more particularly, to a display unit with improved reliability, an electronic apparatus including the same, and a method of manufacturing the electronic apparatus.

Discussion of the Background

An electronic apparatus may provide various functions capable of communicating with a user. For example, the electronic apparatus may display an image to provide information to a user or may sense a user's input. A display unit including a window and a display panel may be assembled with a receiving member and/or other electronic module to manufacture the electronic apparatus. Before the electronic apparatus is finally manufactured by the assembling process, the display unit may be moved by a worker or a process line and may easily come in contact with external components or a worker in this process.

The above information disclosed in this Background section is only for understanding of the background of the inventive concepts, and, therefore, it may contain information that does not constitute prior art.

SUMMARY

The present disclosure may provide a display unit capable of improving process reliability.

The present disclosure may also provide an electronic apparatus with excellent assemblability.

The present disclosure may further provide a method of manufacturing an electronic apparatus, which is capable of improving reliability and of simplifying processes.

Additional features of the inventive concepts will be set forth in the description which follows, and in part will be apparent from the description, or may be learned by practice of the inventive concepts.

In an embodiment of the inventive concepts, a display unit includes a display panel with a base substrate including an active area and a peripheral area adjacent to the active area, a plurality of pixels for displaying an image on the active area, a plurality of signal lines connected to the pixels, and a plurality of pads disposed on the peripheral area and connected to the signal lines, a circuit board connected to the pads and bent from a front surface of the display panel toward a rear surface of the display panel, a window disposed on the front surface of the display panel to cover the active area, and a cover panel film disposed on the rear surface of the display panel and disposed between the display panel and the circuit board. The cover panel film includes a first portion overlapping with the display panel, and a second portion extending from the first portion to protrude from the display panel when viewed in a plan view. The second portion is disposed between the circuit board and the window when viewed in a cross-sectional view.

In an embodiment, a planar area of the window may be greater than a planar area of the display panel, and one of side surfaces of the window, which overlaps with the second portion, may protrude from a side surface of the display panel when viewed in a plan view.

In an embodiment, at least a portion of the circuit board may protrude from the side surface of the display panel when viewed in a plan view, and the second portion may be disposed between the protruding portion of the circuit board and the window.

In an embodiment, the side surface of the display panel may include a first side surface to which the circuit board is connected, a second side surface opposite to the first side surface, and a third side surface connecting the first side surface and the second side surface. The second portion may protrude from one of the second side surface and the third side surface.

In an embodiment, the cover panel film may further include an adhesive member disposed on the first portion. The adhesive member may not overlap with the second portion when viewed in a plan view.

In an embodiment, the adhesive member may have a rework property.

In an embodiment, the circuit board may include a flexible film, first lead-out pads disposed on the flexible film and connected to the pads, and second lead-out pads which are disposed on the flexible film, are spaced apart from the first lead-out pads, and are electrically connected to the first lead-out pads. The second lead-out pads may be exposed from the second portion.

In an embodiment, a protruding width of the second portion from the first portion may be less than a distance from a side surface of the display panel to the second lead-out pads.

In an embodiment, the cover panel film may have a modulus greater than a modulus of the flexible film.

In an embodiment, the pads may be arranged in a first direction, and the first lead-out pads may be facing the second lead-out pads in a second direction intersecting the first direction when viewed in a plan view.

In an embodiment, the second direction may be perpendicular to the first direction.

In an embodiment, the second direction may be a diagonal direction with respect to the first direction.

In an embodiment, the display unit may further include a protective panel disposed between the cover panel film and the display panel. The protective panel may include at least one of a cushion member, a heat dissipation member, or a light blocking member.

In an embodiment, the first portion may partially overlap with the rear surface of the display panel.

In an embodiment of the inventive concepts, an electronic apparatus includes a display unit including a display panel for displaying an image, a circuit board connected to the display panel and bent from a front surface of the display panel toward a rear surface of the display panel, a window disposed on the front surface of the display panel, and a cover panel film disposed on the rear surface of the display panel and including a first portion overlapping with the display panel, and a second portion protruding from the first portion so as to be disposed between the window and the circuit board, and a receiving member receiving the display unit. The second portion and at least a portion of the circuit board protrude from one side surface of the window, and the second portion is disposed between the window and the protruding portion of the circuit board when viewed in a cross-sectional view.

In an embodiment, a modulus of the cover panel film may be greater than a modulus of the circuit board.

In an embodiment, the cover panel film may further include an adhesive member disposed between the first portion and the display panel. The second portion may not overlap with the adhesive member.

In an embodiment of the inventive concepts, a method of manufacturing an electronic apparatus includes providing a display unit including a display panel for displaying an image, a circuit board connected to the display panel and bent from a front surface of the display panel toward a rear surface of the display panel, a window disposed on the front surface of the display panel, and a cover panel film disposed on the rear surface of the display panel and including a first portion overlapping with the display panel, and a second portion protruding from the first portion so as to be disposed between the window and the circuit board, and assembling the display unit with a receiving member.

In an embodiment, the method may further include removing the cover panel film between the providing of the display unit and the assembling of the display unit. The assembling of the display unit may include assembling the display unit, from which the cover panel film is removed, with the receiving member.

In an embodiment, the assembling of the display unit may further include bending a portion of the circuit board, which does not overlap with the display panel, in such a way that the portion of the circuit board overlaps with the display panel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
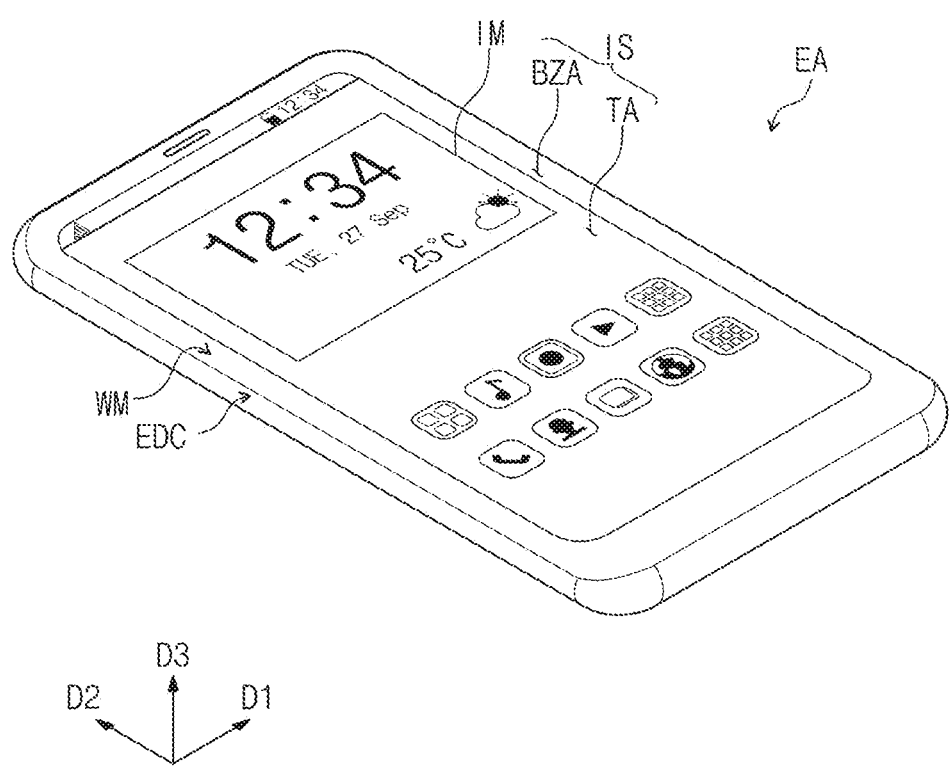
FIG. 1A is an assembled perspective view illustrating an electronic apparatus according to an embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, exemplary embodiments of the inventive concepts will be described in detail with reference to the accompanying drawings.

Figure 1B:
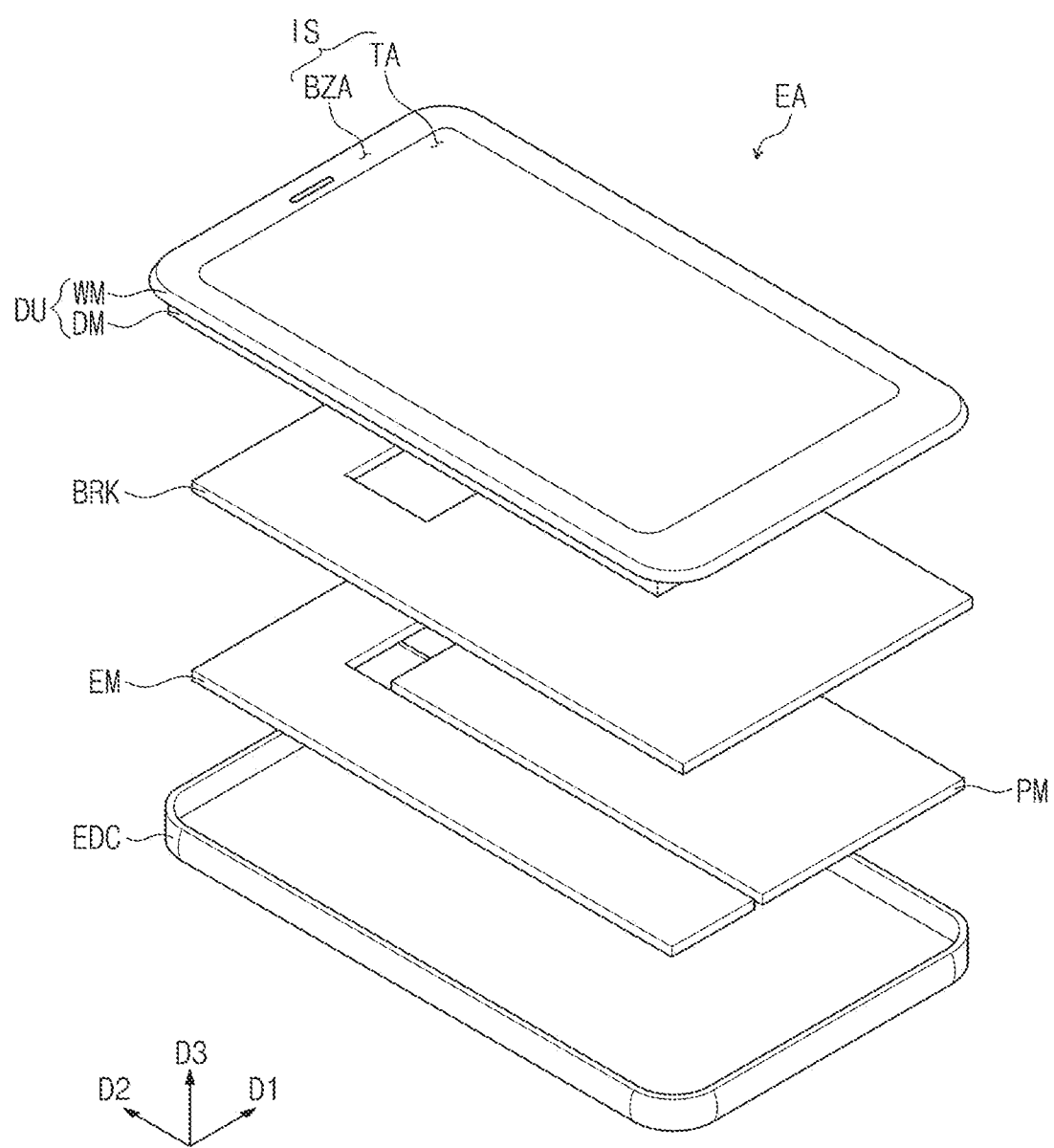
FIG. 1B is an exploded perspective view illustrating the electronic apparatus of FIG. 1A.

FIG. 1A is an assembled perspective view illustrating an electronic apparatus according to an embodiment of the inventive concepts. FIG. 1B is an exploded perspective view illustrating the electronic apparatus of FIG. 1A. Hereinafter, an embodiment of the inventive concepts will be described with reference to FIGS. 1A and 1B.

An electronic apparatus EA may be activated by an electrical signal. The electronic apparatus EA may be implemented through various embodiments. For example, the electronic apparatus EA may be a tablet, a notebook computer, a personal computer, a smart television, or a smart phone. In the present embodiment, the smart phone is illustrated as an example of the electronic apparatus EA.

The electronic apparatus EA may display an image IM on a display surface IS parallel to first and second directions D1 and D2 in a third direction D3. The display surface IS on which the image IM is displayed may correspond to a front surface of the electronic apparatus EA. The image IM may include a dynamic image and a static image. Shapes of a clock and a plurality of icons are exemplary image IM in FIG. 1A.

In the present embodiment, a front surface (or a top surface) and a rear surface (or a bottom surface) of each member may be defined based on a direction (e.g., the third direction D3) in which the image IM is displayed. The front surface and the rear surface may be opposite to each other in the third direction D3, and planes thereof are parallel to each other. A distance between the front surface and the rear surface in the third direction D3 may correspond to a thickness of each member in the third direction D3. Meanwhile, directions indicated by the first to third directions D1, D2 and D3 may be relative concepts and may be changed into other directions. Hereinafter, the first to third directions may be the directions indicated by the first to third directions D1, D2 and D3 as illustrated in FIG. 1A, respectively.

The front surface IS (or the display surface) of the electronic apparatus EA may be divided into a transmission area TA and a bezel area BZA. The transmission area TA may be an area in which the image IM is displayed. A user may view the image IM through the transmission area TA. In the present embodiment, the transmission area TA has a quadrilateral (or rectangular) shape of which corners are rounded. However, embodiments of the inventive concepts are not limited thereto. In other embodiments, transmission area TA may have various shapes.

The bezel area BZA may be adjacent to the transmission area TA. The bezel area BZA may have a predetermined color. The bezel area BZA may surround the transmission area TA when viewed in a plan view. Thus, the shape of the transmission area TA may be substantially defined by the bezel area BZA. However, embodiments of the inventive concepts are not limited thereto. In other embodiments, the bezel area BZA may be adjacent to only one side of the transmission area TA or may be omitted. The electronic apparatus EA according to the embodiment of the inventive concepts may be embodied in many ways and is not limited to a specific embodiment.

Referring to FIG. 1B, the electronic apparatus EA may include a display unit DU, an electronic module EM, a bracket BRK, and a receiving member EDC. The components are simply illustrated in FIG. 1B.

The display unit DU may include a window WM and a display module DM. The window WM may form the exterior of the electronic apparatus EA in the assembled state, as illustrated in FIG. 1A. The window WM may protect internal components of the electronic apparatus EA from an external impact and may be a component providing the display surface IS of the electronic apparatus EA.

The window WM may include glass or plastic. The window WM may have a single-layered or multi-layered structure. For example, the window WM may have a stack structure including a plurality of plastic films coupled to each other by an adhesive or may have a stack structure which includes a glass substrate and a plastic film coupled to each other by an adhesive.

The display module DM may be disposed on a rear surface of the window WM. The display module DM may be a component which substantially generates the image IM. The image IM generated from the display module DM may be displayed on the display surface IS through the transmission area TA and thus may be visible to a user. In the present embodiment, the transmission area TA of the window WM may be an optically transparent area (e.g., an area having a light transmittance of 90% or more), and the bezel area BZA may have a light transmittance lower than that of the transmission area TA. The display module DM will be described later in more detail.

The bracket BRK may be coupled to the display unit DU and/or the receiving member EDC to divide an inner space of the electronic apparatus EA. The bracket BRK may provide a space in which other components are disposed. In addition, the bracket BRK may support the display unit DU to fix the display unit DU without shaking. A coupling recess (not shown) corresponding to a shape of the electronic module EM may be defined in the bracket BRK to fix the electronic module EM. The bracket BRK may include a metal or plastic member. One bracket BRK is illustrated as an example. Alternatively, the electronic apparatus EA may include a plurality of brackets BRKs.

The electronic module EM may include a motherboard, and various functional modules mounted on the motherboard and used to operate the electronic apparatus EA. The motherboard may be electrically connected to the display unit DU through a connector (not shown). Here, the motherboard may include a rigid printed circuit board.

The electronic module EM may include a control module, a wireless communication module, an image input module, a sound input module, a sound output module, a memory, an external interface, a light emitting module, a light receiving module, and/or a camera module. In an embodiment, some of the modules may not be mounted on the motherboard but may be electrically connected to the motherboard through a flexible circuit board.

The receiving member EDC may be coupled to the bracket BRK and/or the display unit DU. In the present embodiment, the receiving member EDC may form the exterior of the electronic apparatus EA together with the window WM. In the present embodiment, the receiving member EDC in one body is illustrated as an example. However, embodiments of the inventive concepts are not limited thereto. In another embodiment, the receiving member EDC may include a plurality of bodies assembled with each other. The receiving member EDC may include a plurality of frames and/or plates which are formed of glass, plastic, and/or a metal.

Figure 2A:
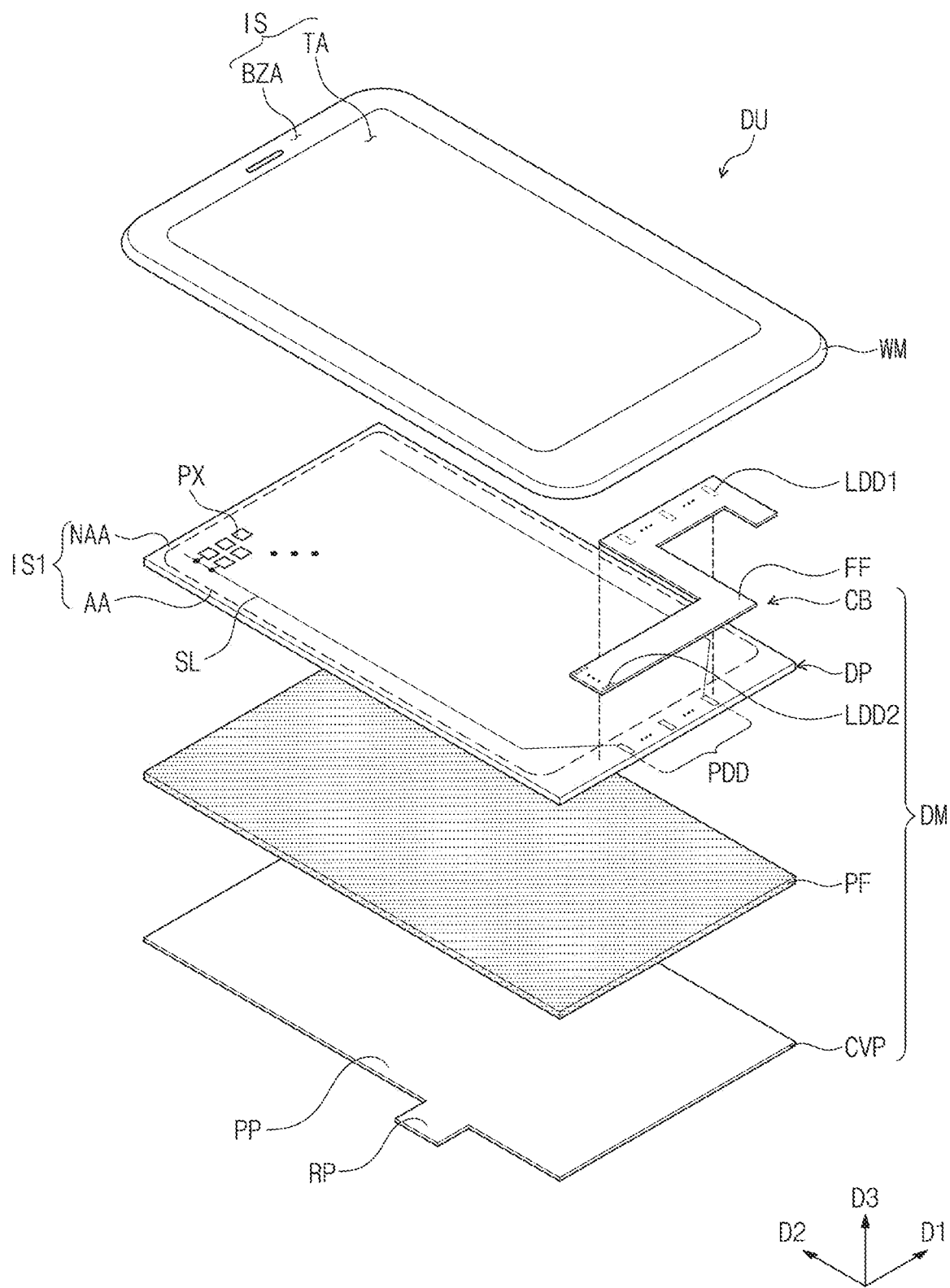
FIG. 2A is an exploded perspective view illustrating a display unit according to an embodiment of the inventive concepts.
Figure 2B:
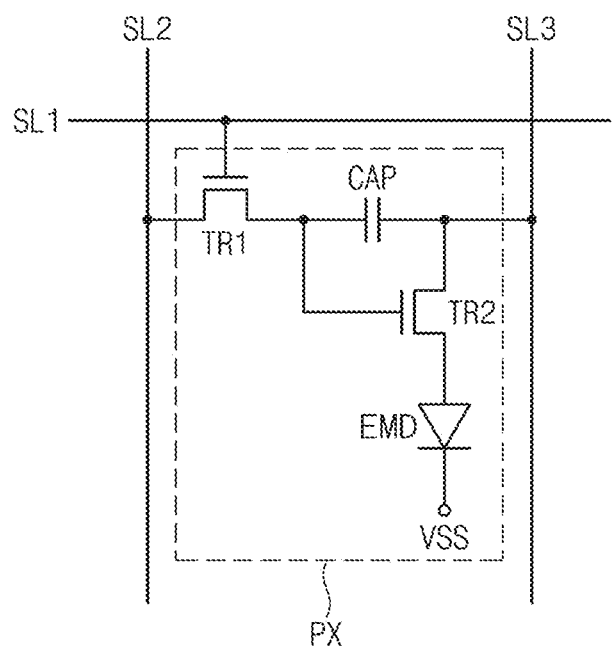
FIG. 2B is a signal circuit diagram illustrating some components of FIG. 2A.

FIG. 2A is an exploded perspective view illustrating a display unit according to an embodiment of the inventive concepts. FIG. 2B is a signal circuit diagram illustrating some components of FIG. 2A. Hereinafter, the display module DM according to an embodiment of the inventive concepts will be described with reference to FIGS. 2A and 2B.

The display unit DU may include the window WM and the display module DM. The display module DM may include a display panel DP, a circuit board CB, a protective panel PF, and a cover panel film CVP. The protective panel PF may be referred to as a "cover panel".

The display panel DP may generate the image IM (see FIG. 1A) by an electrical signal. A front surface IS1 of the display panel DP may include an active area AA and a peripheral area NAA. The front surface IS1 of the display panel DP is corresponding to a base substrate. The active area AA may be an area in which the image IM is displayed. The display panel DP may activate the active area AA by an electrical signal. The image IM may be displayed in the activated active area AA. The transmission area TA may overlap at least the entire active area AA.

The peripheral area NAA may be adjacent to the active area AA. The peripheral area NAA may surround an edge of the active area AA when viewed in a plan view. However, embodiments of the inventive concepts are not limited thereto. In another embodiment, the peripheral area NAA may be adjacent to only a portion of the edge of the active area AA.

Various kinds of signal lines and/or electronic elements for providing electrical signals to the active area AA may be disposed in the peripheral area NAA. The peripheral area NAA may be covered by the bezel area BZA and thus may not be visible to the outside.

The display panel DP may include a plurality of pixels PX, a plurality of signal lines SL, and a plurality of pads PDD disposed on the substrate. The signal lines SL may be connected to the pixels PX to provide electrical signals to the pixels PX. Each of the pixels PX may generate light by electrical signals transmitted through the signal lines SL to realize the image IM in the active area AA.

Referring to FIG. 2B, for example, the pixel PX may be connected to a first signal line SL1, a second signal line SL2 and a third signal line SL3 of the signal lines SL. The first signal line SL1 may be a gate line for transmitting a gate signal. The first signal line SL1 (hereinafter, referred to as the gate line) may be provided in plurality, and the plurality of gate lines SL1 may be arranged in a direction intersecting an extending direction of the gate line SL1 so as to be electrically connected to the pixels PX.

The second signal line SL2 may intersect the gate line SL1 and may be insulated from the gate line SL1. The second signal line SL2 may be a data line for transmitting a data signal. The second signal line SL2 (hereinafter, referred to as the data line) may be provided in plurality, and the plurality of data lines SL2 may be arranged in a direction intersecting an extending direction of the data line SL2 so as to be electrically connected to the pixels PX.

The third signal line SL3 may be a power line for transmitting a first power source signal. In the present embodiment, the third signal line SL3 (hereinafter, referred to as the power line) may intersect the gate line SL1 and may be insulated from the gate line SL1. The power line SL3 may be provided in plurality, and the plurality of power lines SL3 may be arranged in a direction intersecting an extending direction of the power line SL3 so as to be electrically connected to the pixels PX.

However, embodiments of the inventive concepts are not limited thereto. In other embodiments, the pixel PX may be additionally connected to at least one of other various signal lines such as an emission control line and an initialization voltage line.

The pixel PX may include a first thin film transistor TR1, a second thin film transistor TR2, a capacitor CAP, and a light emitting element EMD. The first thin film transistor TR1, the second thin film transistor TR2, the capacitor CAP and the light emitting element EMD may be electrically connected to each other. In the present embodiment, the whole of the pixel PX is disposed in the active area AA. However, embodiments of the inventive concepts are not limited thereto. In other embodiments, one or some components (e.g., the first thin film transistor TR1, the second thin film transistor TR2, and/or the capacitor CAP) of the pixel PX may be disposed in the peripheral area NAA.

The first thin film transistor TR1 may be a switching element configured to control turn-on and turn-off of the pixel PX. The first thin film transistor TR1 may be connected to the gate line SL1 and the data line SL2. The first thin film transistor TR1 may be turned-on by the gate signal provided through the gate line SL1 and may provide the data signal provided through the data line SL2 to the capacitor CAP.

The capacitor CAP may store a voltage corresponding to a potential difference between the first power source signal provided from the power line SL3 and the data signal provided from the first thin film transistor TR1. The second thin film transistor TR2 may provide the first power source signal provided from the power line SL3 to the light emitting element EMD in response to the voltage stored in the capacitor CAP.

The light emitting element EMD may generate light or control the amount of light by an electrical signal. For example, the light emitting element EMD may include an organic light emitting element, a quantum dot light emitting element, an electrophoretic element, or an electrowetting element.

The light emitting element EMD may be connected to a power source terminal VSS and may receive a second power source signal different from the first power source signal provided from the power line SL3. A driving current corresponding to a difference between the second power source signal and the electrical signal provided from the second thin film transistor TR2 may flow through the light emitting element EMD, and the light emitting element EMD may generate light corresponding to the driving current.

However, embodiments of the inventive concepts are not limited thereto. The components of the pixel PX may be variously modified or changed and may be variously arranged. Further, the pixel structure may include other displays, including but not limited to, LCD (liquid crystal display), LED (light emitting diode) and any other light emitting devices.

Referring again to FIG. 2A, the pads PDD may be disposed in the peripheral area NAA. The pads PDD may be connected to the signal lines SL. The pixels PX may be electrically connected to elements or devices, disposed outside the display panel DP, through the pads PDD.

The circuit board CB may be connected to the pads PDD. The circuit board CB may provide electrical signals to the display panel DP through the pads PDD. The circuit board CB may generate signals for controlling the image IM and/or power source signals and may provide the generated signals to the display panel DP.

The circuit board CB may include a flexible film FF, first lead-out pads LDD1, and second lead-out pads LDD2. The flexible film FF may be highly flexible. Even though not shown in the drawings, the flexible film FF may include circuit lines (not shown) connecting the first lead-out pads LDD1 and the second lead-out pads LDD2. In addition, the flexible film FF may further include a driving IC. However, the inventive concepts are not limited to one embodiment.

The first lead-out pads LDD1 may be disposed on one side portion of the flexible film FF. The first lead-out pads LDD1 may be disposed at positions facing the pads PDD of the display panel DP. When the circuit board CB is connected to the display panel DP, the first lead-out pads LDD1 may be connected to the pads PDD, respectively, to electrically connect the circuit board CB and the display panel DP. Meanwhile, even though not shown in the drawings, a conductive coupling member (e.g., an anisotropic conductive adhesive (ACF) film or solder) may be provided between the circuit board CB and the display panel DP.

The second lead-out pads LDD2 may be disposed on another side portion of the flexible film FF. The second lead-out pads LDD2 may be electrically connected to an electronic component (not shown). The second lead-out pads LDD2 may be connected to a test device for testing the display unit DU to receive a test signal or may be connected to the electronic module EM (see FIG. 1B) or a power module PM (see FIG. 1B).

The circuit board CB may be bent from the front surface IS1 of the display panel DP toward a rear surface of the display panel DP and then may be assembled to the electronic apparatus EA. This will be described later in more detail.

The protective panel PF may be disposed on the rear surface of the display panel DP. The protective panel PF may cover the rear surface of the display panel DP. Even though not shown in the drawings, an additional adhesive member may be disposed between the protective panel PF and the display panel DP.

The protective panel PF may include at least one of an embossed sheet, a cushion sheet, a heat dissipation sheet, or a light blocking sheet. The embossed sheet may include fine bends to prevent non-uniform bubbles from being formed between the display panel DP and the protective panel PF, and thus improving bondage between the display panel DP and the protective panel PF. The cushion sheet may absorb an external impact to protect the display panel DP and may include sponge, foam, and/or urethane resin. The heat dissipation sheet may easily exhaust or release heat generated from the display panel DP to the outside and may include a metal having high heat conductivity. The light blocking sheet may have strong light blocking properties and may render the rear surface of the display panel DP not visible to the outside. For example, the light blocking sheet may include a carbon sheet. In certain embodiments, the protective panel PF may be omitted in the display unit DU.

The cover panel film CVP may be disposed on the rear surface of the display panel DP. The cover panel film CVP may include any of materials such as an acryl-based compound, polyethylene terephthalate (PET), or polyimide (PI). The cover panel film CVP may include a first portion PP and a second portion RP. The first portion PP may overlap with the display panel DP when viewed in a plan view. In the present embodiment, the first portion PP may have a planar area which is substantially equal to a planar area of the display panel DP.

The second portion RP may be connected to the first portion PP and may protrude from the first portion PP in one direction. In the present embodiment, the second portion RP may protrude from the first portion PP. The second portion RP may not overlap with the display panel DP when viewed in a plan view.

The second portion RP may have a modulus greater than that of the circuit board CB. In more detail, the second portion RP may have a higher modulus than the flexible film FF. Thus, the second portion RP may be less flexible than the flexible film FF. This will be described later in more detail.

In the present embodiment, the first portion PP and the second portion RP may be formed as a single unitary body. For example, the first portion PP and the second portion RP may be formed of the same material and may be connected to each other without a coupling member to constitute a single unitary body shape. However, embodiments of the inventive concepts are not limited thereto. In another embodiment, the first portion PP and the second portion RP may be formed independently of each other and may be coupled to each other through a coupling member such as an adhesive member.

Figure 3A:
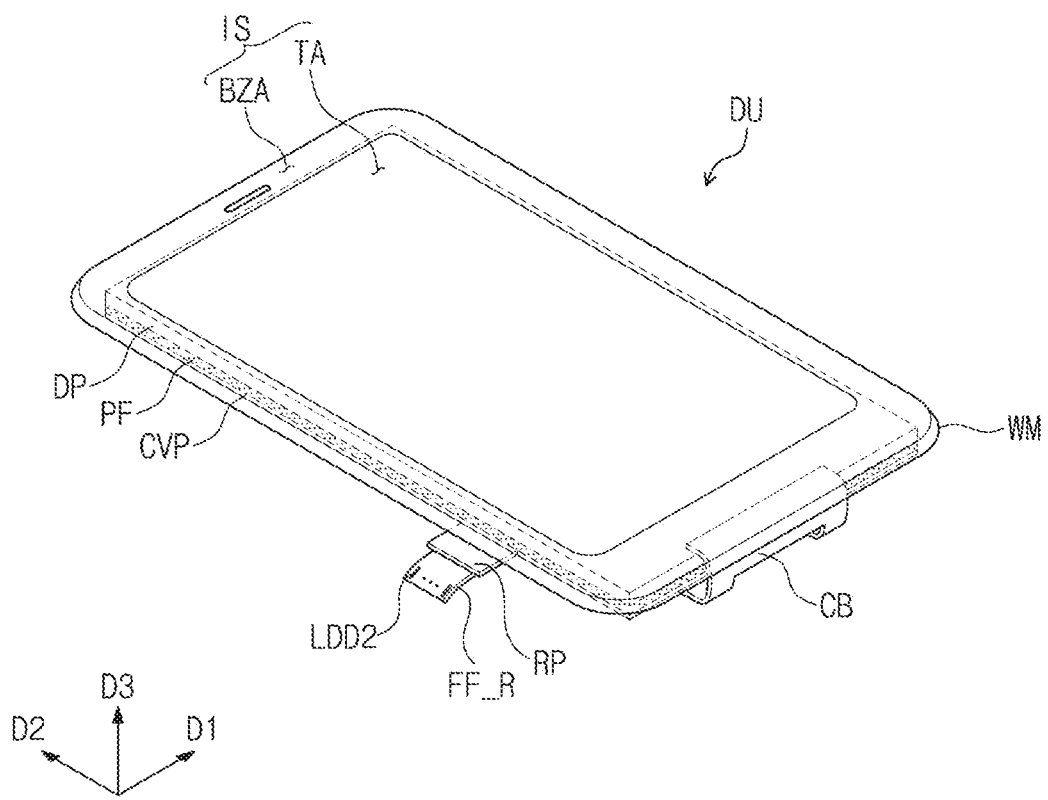
FIGS. 3A and 3B are perspective views illustrating a display unit according to an embodiment of the inventive concepts.
Figure 3B:
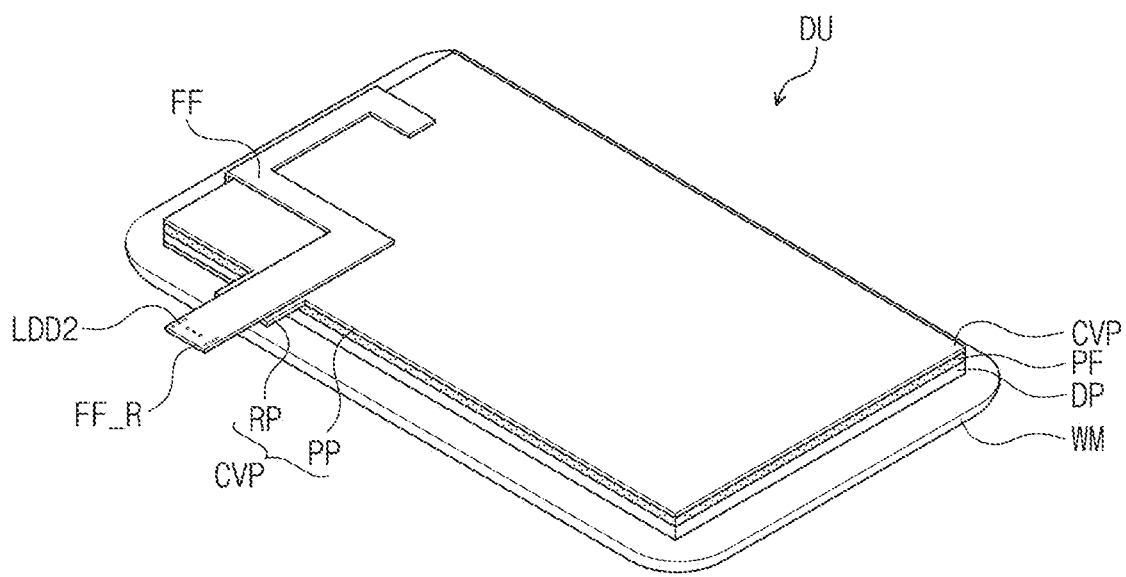
Figure 3B:
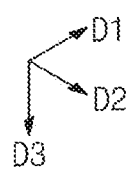
Figure 4A:
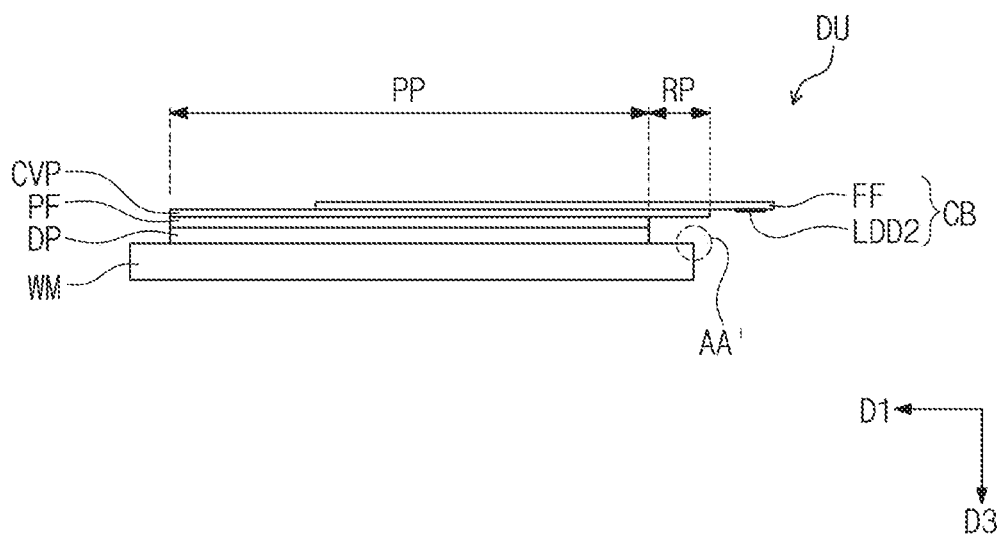
FIGS. 4A and 4B are cross-sectional views illustrating a display unit according to an embodiment of the inventive concepts.
Figure 4B:
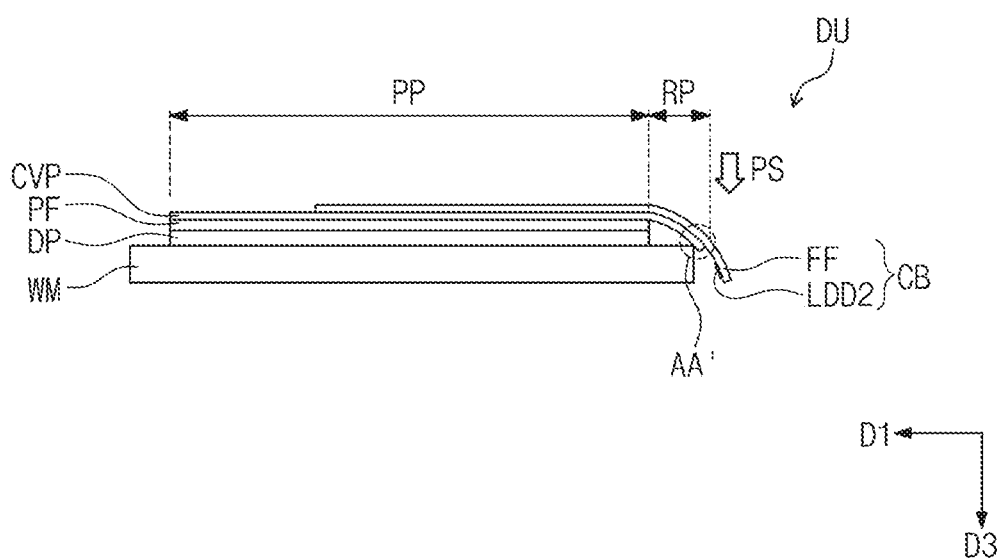

FIGS. 3A and 3B are perspective views illustrating a display unit according to an embodiment of the inventive concepts. FIGS. 4A and 4B are cross-sectional views illustrating a display unit according to an embodiment of the inventive concepts. FIG. 3A is a perspective view showing the front surface of the display unit DU, and FIG. 3B is a perspective view showing the rear surface of the display unit DU. FIG. 4A is a cross-sectional view showing the display unit DU in a first state, and FIG. 4B is a cross-sectional view showing the display unit DU in a second state. Hereinafter, an embodiment of the inventive concepts will be described with reference to FIGS. 3A and 3B. Meanwhile, the same components as described with reference to FIGS. 1A to 2B will be indicated by the same reference designators, and the descriptions thereto will be omitted for the purpose of ease and convenience in description.

At least a portion of the circuit board CB and at least a portion of the cover panel film CVP may protrude outside the window WM when viewed from the front surface of the display panel DP. The second portion RP of the cover panel film CVP may protrude from a side surface of the display panel DP and may be exposed from the window WM.

The circuit board CB may protrude from the side surface of the display panel DP in a bent state. A portion FF_R of the circuit board CB (hereinafter, referred to as a protrusion of the circuit board CB) may protrude from the side surface of the display panel DP and may be exposed from the window WM. The protrusion FF_R of the circuit board CB may be a portion on which the second lead-out pads LDD2 are disposed.

A portion of the cover panel film CVP may be disposed between the circuit board CB and the window WM. In the present embodiment, the second portion RP may be disposed between the protrusion FF_R of the circuit board CB and the window WM.

In the present embodiment, the second lead-out pads LDD2 may not be covered by the second portion RP but may be exposed. Thus, it is possible to prevent interference between the second portion RP and an electrical component connected to the second lead-out pads LDD2 in a manufacturing process or an assembling process. As a result, the second lead-out pads LDD2 may be stably connected to the electrical component.

Referring to FIG. 4A, the first state may be a state without external impact. At this time, the protrusion of the circuit board CB may be supported by the second portion RP. As described above, the second portion RP may have greater modulus than the flexible film FF. Thus, the protrusion of the circuit board CB may be stably supported by the second portion RP to maintain a separation of the protrusion of the circuit board CB apart from the window WM.

Referring to FIG. 4B, the second state may be a state where an external impact PS is applied. The protrusion of the circuit board CB may be bent in the third direction D3 by the external impact PS occurring in the third direction D3. The external impact PS may occur in movement of the display unit DU in a process of assembling the electronic apparatus EA (see FIG. 1A) or may be an impact applied to the assembled electronic apparatus EA.

Due to the external impact PS, the second portion RP disposed between the window WM and the protrusion of the circuit board CB may come in contact with the window WM instead of the protrusion of the circuit board CB. Thus, the circuit board CB may be protected from colliding with the window WM.

According to the embodiments of the inventive concepts, the second portion RP may prevent the circuit board CB from being in direct contact with the window WM, and thus it is possible to prevent damage of the circuit board CB by the collision with the window WM. As a result, reliability of the display unit DU may be improved.

Figure 5A:
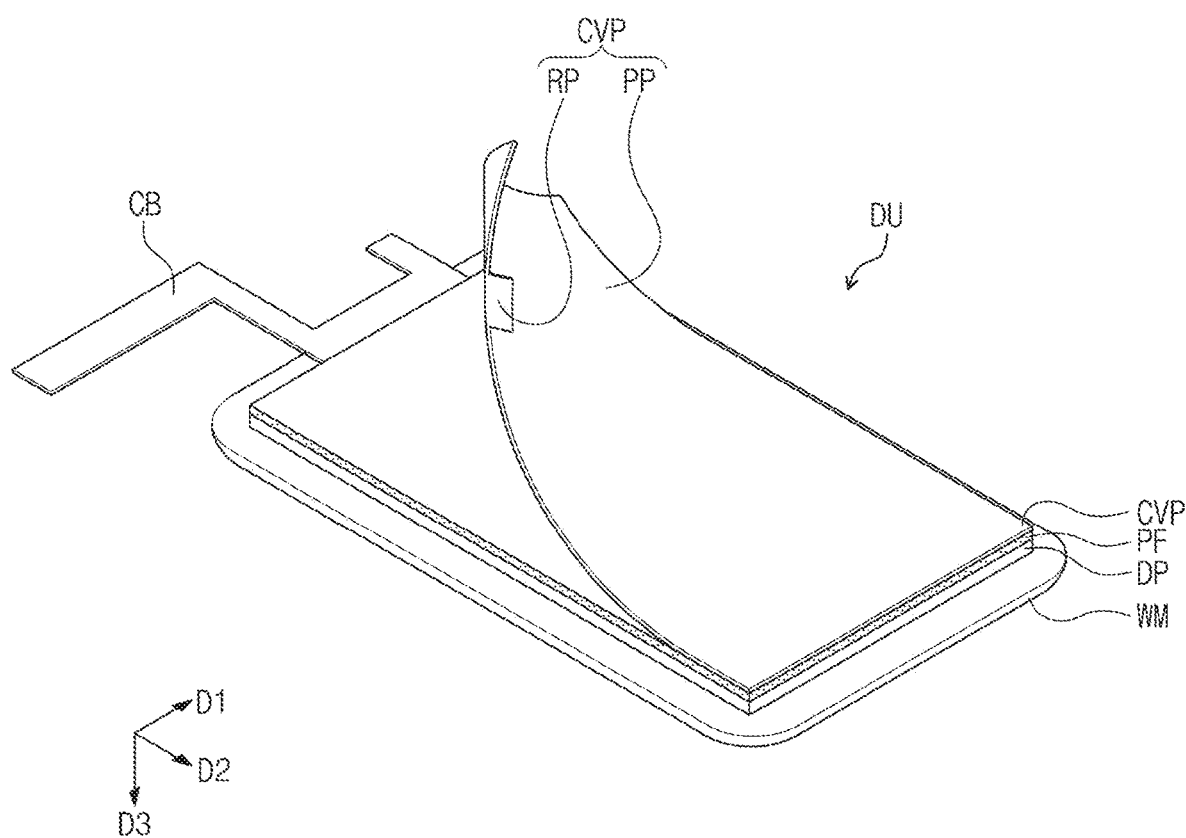
FIGS. 5A and 5B are perspective views illustrating a display unit according to an embodiment of the inventive concepts.
Figure 5B:
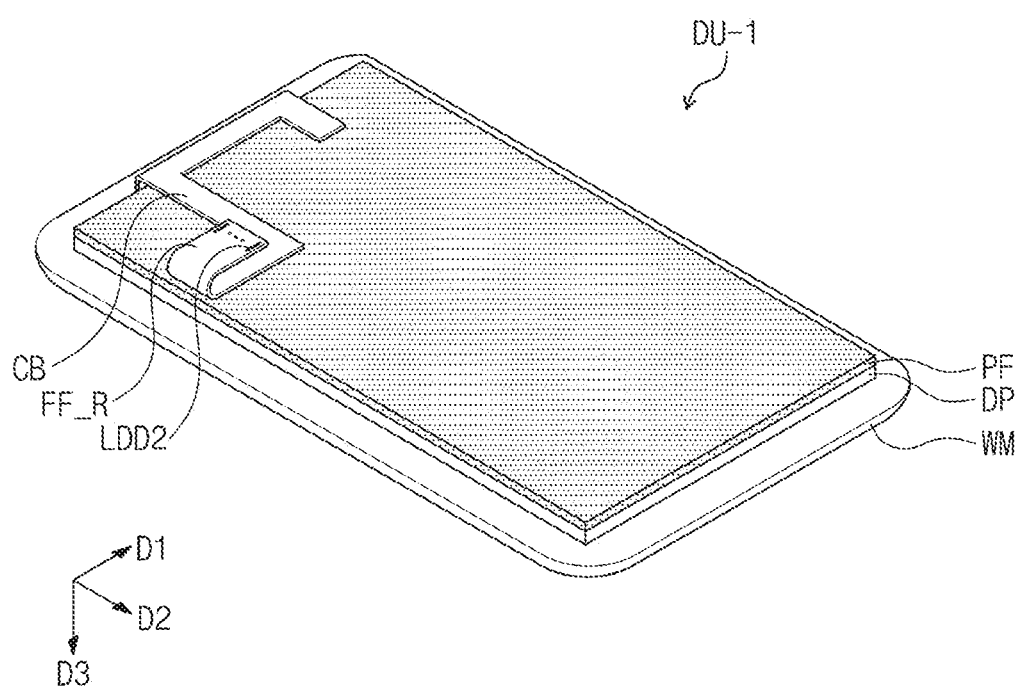

FIGS. 5A and 5B are perspective views illustrating a display unit according to an embodiment of the inventive concepts. FIGS. 5A and 5B are perspective views showing the rear surface of the display unit. Hereinafter, an embodiment of the inventive concepts will be described with reference to FIGS. 5A and 5B.

As illustrated in FIGS. 5A and 5B, the cover panel film CVP may be omitted in a display unit DU-1. Here, the display unit DU of FIG. 5A may be in a state before being assembled to the electronic apparatus EA, and the display unit DU-1 of FIG. 5B may be in a state where it is assembled to the electronic apparatus EA.

In the present embodiment, the cover panel film CVP may have a rework property. Thus, the cover panel film CVP may protect the display panel DP and/or the protective panel PF and prevent a collision between the circuit board CB and the window WM before being assembled to the electronic apparatus EA and/or during a process of testing and/or moving the display unit DU.

Thereafter, the cover panel film CVP may be removed from the display panel DP immediately before the assembling process, and the protrusion FF_R of the circuit board CB may be bent to overlap with the rear surface of the display panel DP and then may be assembled to the electronic apparatus EA. Since the cover panel film CVP is removed, the circuit board CB may be disposed on an exposed rear surface of the protective panel PF.

According to the embodiments of the inventive concepts, the cover panel film CVP may protect the circuit board CB from damaged by a collision between the circuit board CB and the window WM. Such collision may occur by interference with an external component and/or worker's mishandling of device before the assembling process.

In addition, the cover panel film CVP may protect the display module, and thus it is possible to prevent the rear surface of the display module from being damaged by a contaminant or impact that may occur in the manufacturing process. Furthermore, since the electronic apparatus EA is assembled after removing the cover panel film CVP, interference between the second portion RP and other component (s) may be prevented. This may improve convenience and efficiency in assembling the display unit DU-1.

Meanwhile, according to some embodiments of the inventive concepts, the cover panel film CVP may be easily attachable and detachable, and thus the cover panel film CVP may be easily replaced with a new cover panel film when it is damaged in a process. This may be improve the rework-ability of the display unit DU-1, which may reduce a cost of the process of assembling the electronic apparatus using the display unit DU-1 and improve assembly efficiency.

Figure 6A:
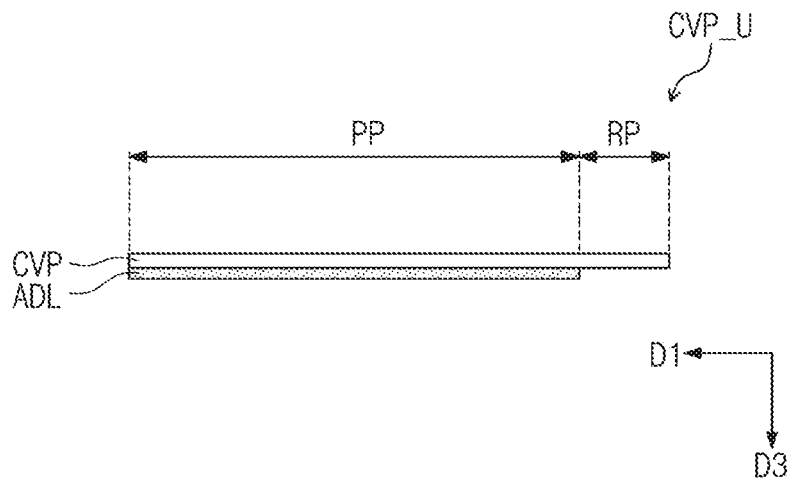
FIG. 6A is a cross-sectional view illustrating a cover panel film according to an embodiment of the inventive concepts.
Figure 6B:
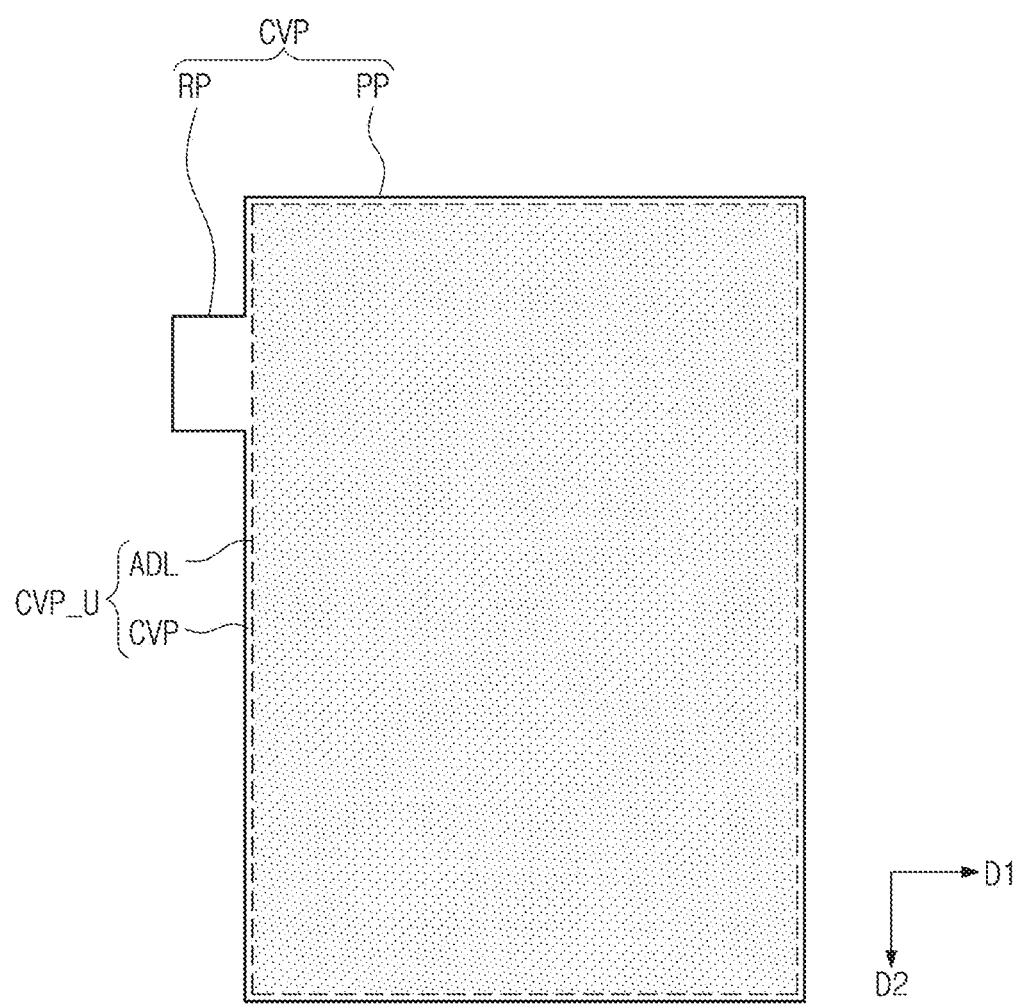
FIG. 6B is a plan view illustrating a cover panel film according to an embodiment of the inventive concepts.

FIG. 6A is a cross-sectional view illustrating a cover panel film according to an embodiment of the inventive concepts. FIG. 6B is a plan view illustrating a cover panel film according to an embodiment of the inventive concepts. Hereinafter, a cover panel film CVP_U according to an embodiment of the inventive concepts will be described with reference to FIGS. 6A and 6B.

The cover panel film CVP_U may further include an adhesive member ADL disposed on the first portion PP. The adhesive member ADL may be permanently adhesive and/or detachably adhesive. In the present embodiment, the adhesive member ADL is shaded for the purpose of ease and convenience in description and illustration.

The adhesive member ADL may be disposed on one surface of the first portion PP. The adhesive member ADL may couple the first portion PP to the display panel DP (see FIG. 2A) or may couple the first portion PP to the protective panel PF (see FIG. 2A).

The adhesive member ADL may be spaced apart from the second portion RP when viewed in a plan view. The adhesive member ADL may not overlap with the second portion RP when viewed in a plan view. The second portion RP may function as a handle when the cover panel film CVP_U is detached.

According to the embodiments of the inventive concepts, the cover panel film CVP_U may further include the adhesive member ADL, which may improve the rework property of the cover panel film CVP_U and bonding strength with the display panel DP or the protective panel PF.

Figure 7A:
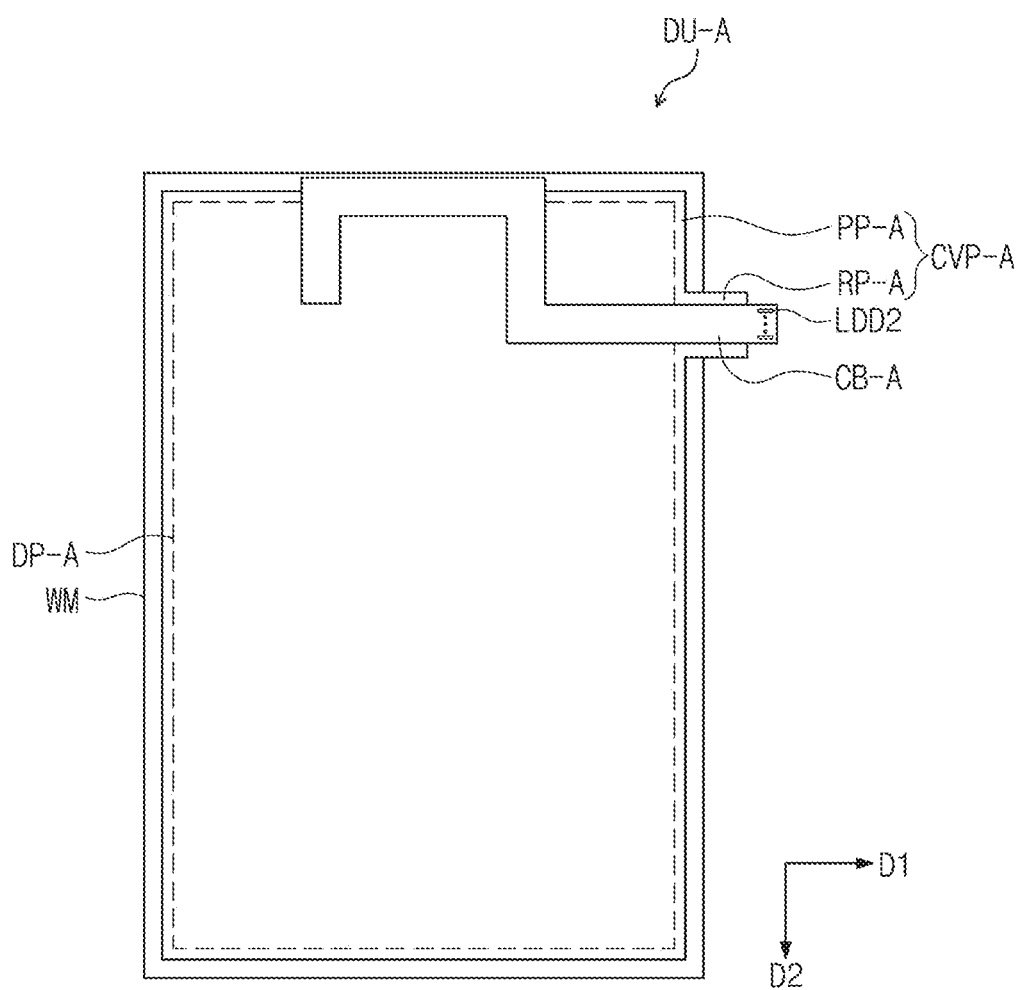
FIGS. 7A, 7B, and 7C are plan views illustrating display units according to some embodiments of the inventive concepts.
Figure 7B:
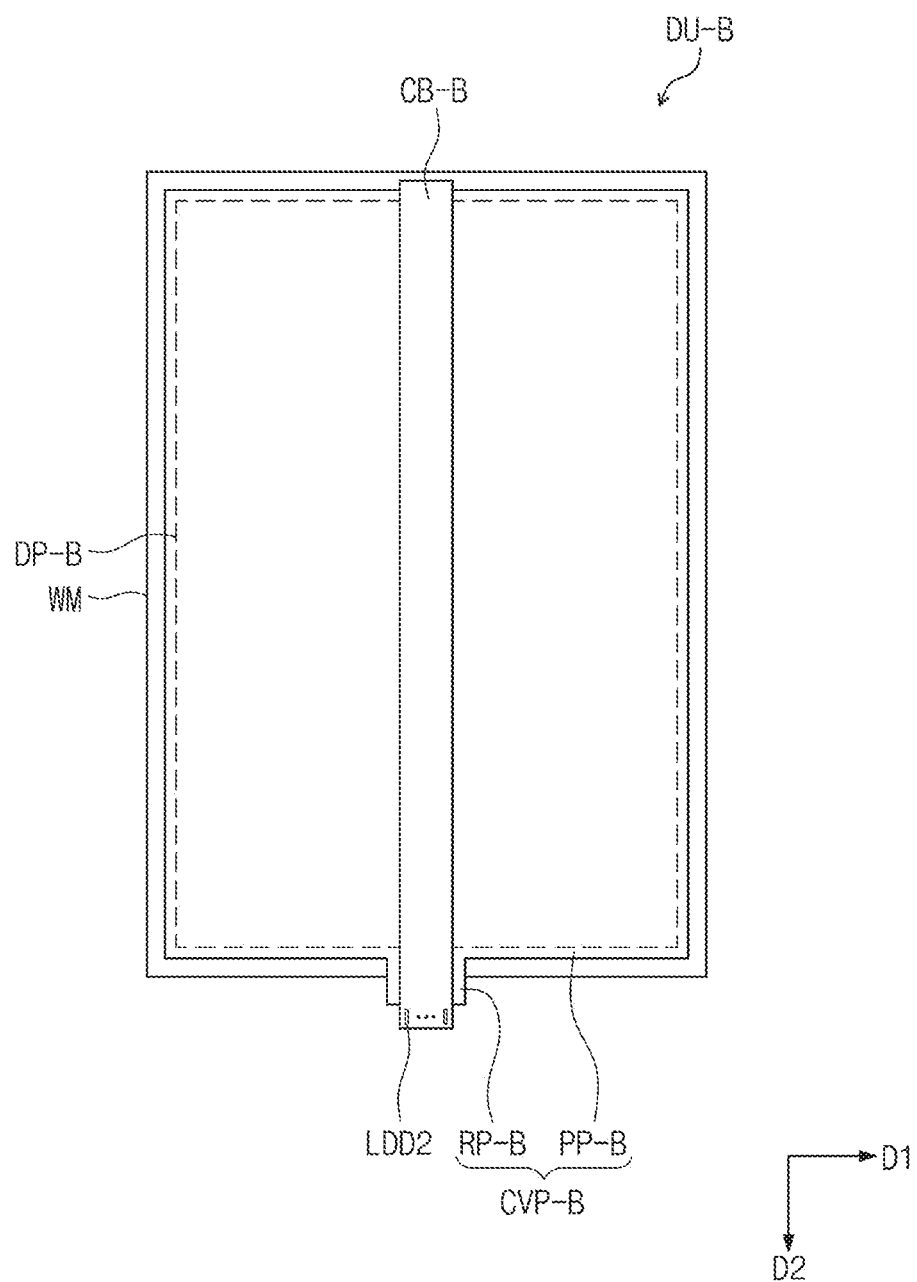
Figure 7C:
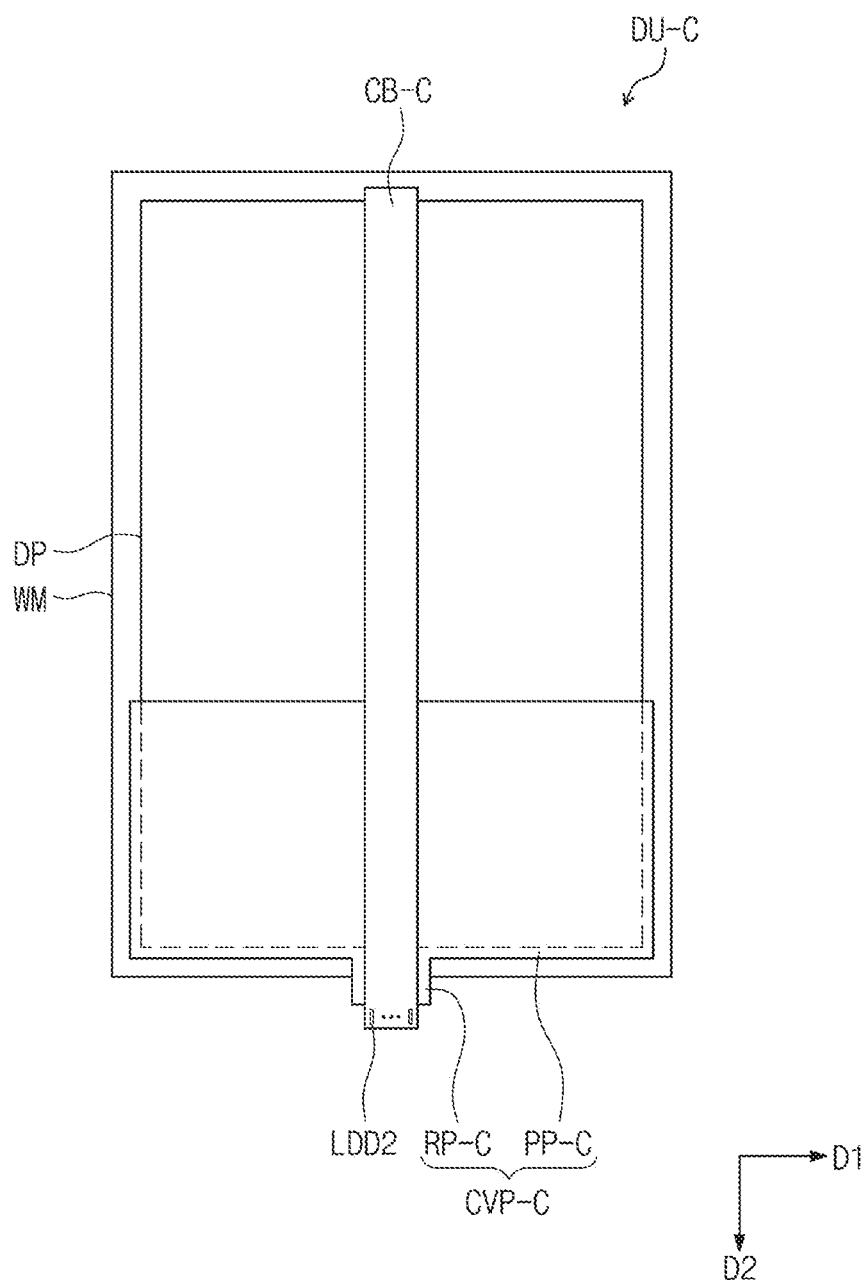

FIGS. 7A to 7C are plan views illustrating display units according to some embodiments of the inventive concepts. FIGS. 7A to 7C are plan views showing rear surfaces of display units DU-A, DU-B and DU-C, respectively. Hereinafter, embodiments of the inventive concepts will be described with reference to FIGS. 7A to 7C.

As illustrated in FIG. 7A, in a display unit DU-A, a portion of a circuit board CB-A may protrude from a side surface of a display panel DP-A in the first direction D1. As described above, a second portion RP-A of a cover panel film CVP-A may be disposed between the window WM and the protrusion of the circuit board CB-A.

Thus, the second portion RP-A may protrude from a first portion PP-A of the cover panel film CVP-A in the first direction D1. According to embodiments of the inventive concepts, a position of the second portion RP-A may vary under the condition that the second portion RP-A is disposed between the circuit board CB-A and the window WM.

As illustrated in FIG. 7B, a circuit board CB-B may have a shape extending in the second direction D2 in a display unit DU-B. In this case, the second lead-out pads LDD2 may be spaced apart from the first lead-out pads LDD1 (see FIG. 2A) in the second direction D2.

A second portion RP-B of a cover panel film CVP-B may be disposed between the window WM and a portion of the circuit board CB-B protruding from a side surface of a display panel DP-B. Thus, the second portion RP-B may protrude from a first portion PP-B of the cover panel film CVP-B in the second direction D2. According to embodiments of the inventive concepts, a position of the second portion RP-B may vary under the condition that the second portion RP-B is disposed between the circuit board CB-B and the window WM.

As illustrated in FIG. 7C, a cover panel film CVP-C may partially overlap with the display panel DP in a display unit DU-C. The display panel DP, a circuit board CB-C and the window WM of the display unit DU-C may correspond to the display panel DP-B, the circuit board CB-B and the window WM of FIG. 7B, respectively, and thus detailed descriptions thereto are omitted.

The cover panel film CVP-C may include a first portion PP-C and a second portion RP-C. The second portion RP-C may correspond to the second portion RP-B of FIG. 7B, and thus detailed descriptions thereto are omitted. The first portion PP-C may partially cover the rear surface of the display panel DP.

Thus, at least a portion of the rear surface of the display panel DP may be exposed from the cover panel film CVP-C (i.e., the first portion PP-C) when viewed from the rear surface of the display panel DP. A portion of the circuit board CB-C may cover the rear surface of the display panel DP, and another portion of the circuit board CB-C may cover a rear surface of the cover panel film CVP-C.

According to embodiments of the inventive concepts, the shape of the first portion PP-C of the cover panel film CVP-C may be variously modified under the condition that the second portion RP-C is provided between the circuit board CB-C and the window WM.

Figure 8A:
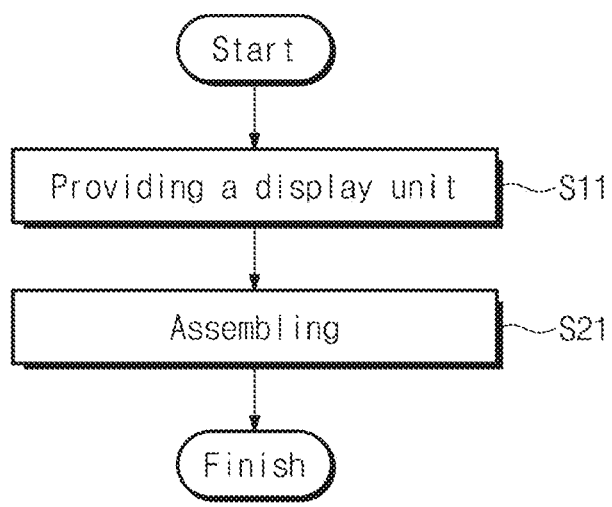
FIGS. 8A and 8B are flowcharts schematically illustrating methods of manufacturing an electronic apparatus, according to some embodiments of the inventive concepts.
Figure 8B:
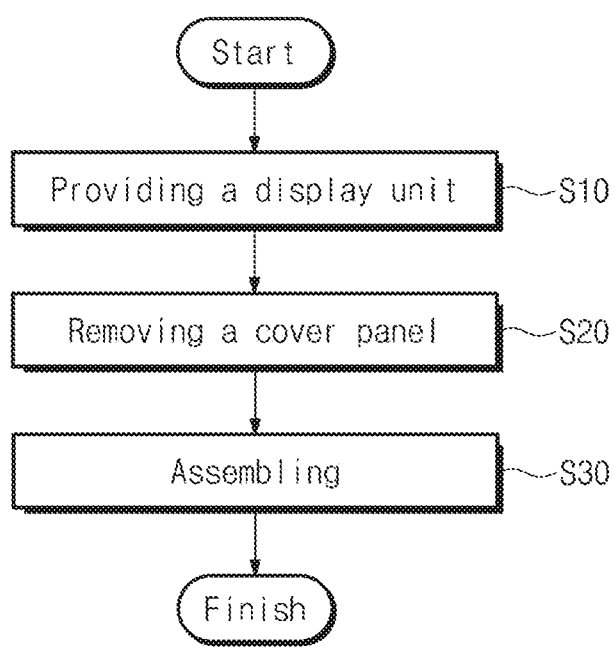

FIGS. 8A and 8B are flowcharts schematically illustrating methods of manufacturing an electronic apparatus, according to some embodiments of the inventive concepts. FIG. 8A illustrates a method of manufacturing an electronic apparatus using the display unit DU of FIG. 3A, and FIG. 8B illustrates a method of manufacturing an electronic apparatus using the display unit DU-1 of FIG. 5B. Hereinafter, embodiments of the inventive concepts will be described with reference to FIGS. 8A and 8B.

As illustrated in FIG. 8A, a method of manufacturing an electronic apparatus may include providing a display unit (S11) and assembling (S21). The providing S11 of the display unit may include providing the display unit DU illustrated in FIG. 3A. In other words, according to the embodiments of the inventive concepts, the display unit DU to which the cover panel film CVP (see FIG. 3A) is attached may be assembled to the electronic apparatus through the assembling S21. Meanwhile, even though not shown in the drawings, the manufacturing method may further include testing the display unit or coupling the display unit to the electronic module between the providing S11 of the display unit and the assembling S21.

As illustrated in FIG. 8B, a method of manufacturing an electronic apparatus may further include removing a cover panel film (S20), as compared with the method of manufacturing the electronic apparatus in FIG. 8A. Providing a display unit (S10) and assembling (S30) may substantially correspond to the providing of the display unit (S11) and the assembling (S21), respectively, and thus detailed descriptions thereto are omitted.

The removal step S20 of the cover panel film may mean providing the display unit DU-1 from which the cover panel film CVP is removed, as illustrated in FIGS. 5A and 5B. When the cover panel film CVP is easily detached, the cover panel film CVP may be removed, and the protrusion FF_R of the circuit board CB (see FIG. 5B) may be additionally bent. Thus, all components of the display unit DU-1 may not protrude outside the window WM (see FIG. 5B) when viewed from the rear surface of the display panel DP (see FIG. 5B).

According to the embodiments of the inventive concepts, it is possible to prevent interference between the circuit board CB and other components (e.g., the receiving member) in the assembling S30, and thus assemblability of the display unit DU-1 may be improved.

Figure 9A:
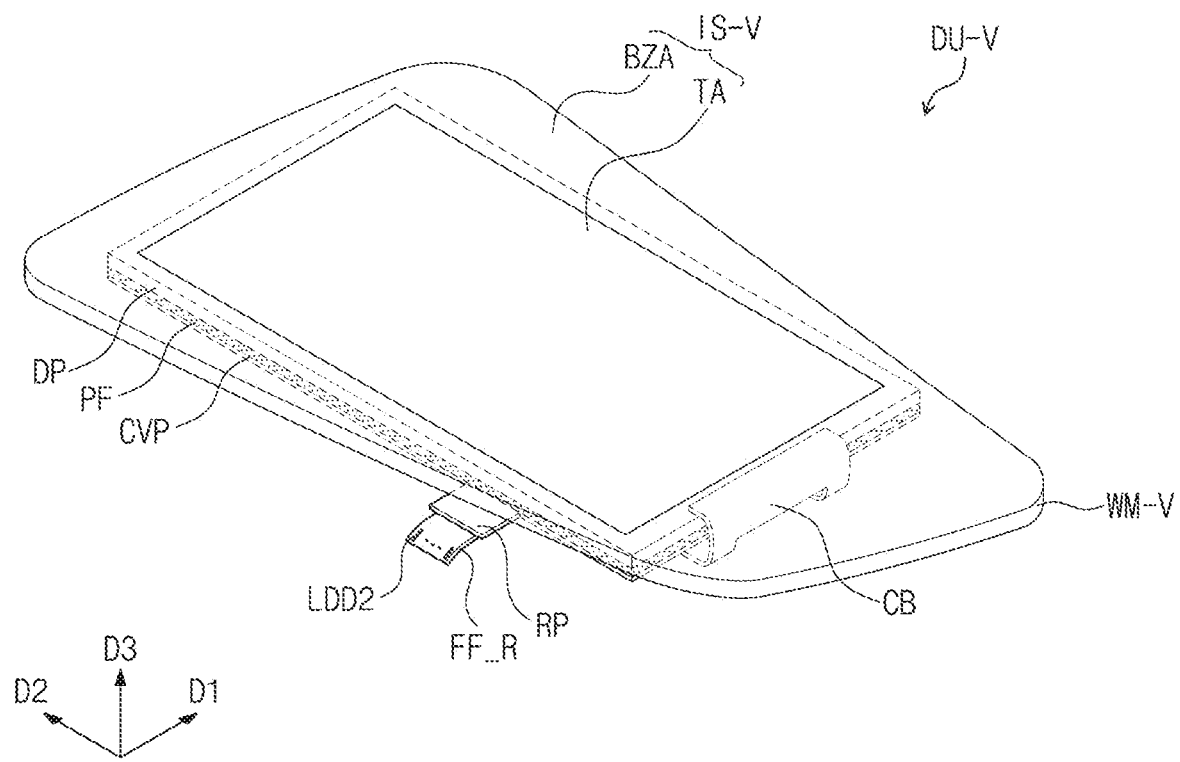
FIGS. 9A and 9B are perspective views illustrating a display unit according to an embodiment of the inventive concepts.
Figure 9B:
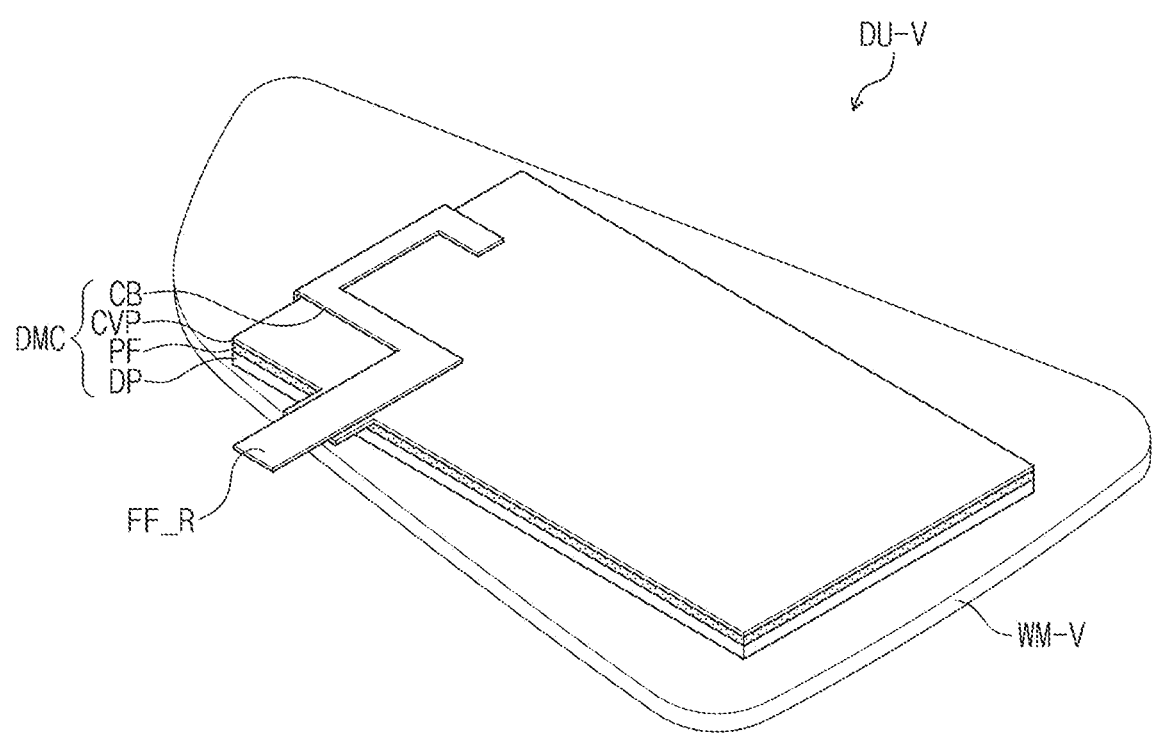
Figure 10A:
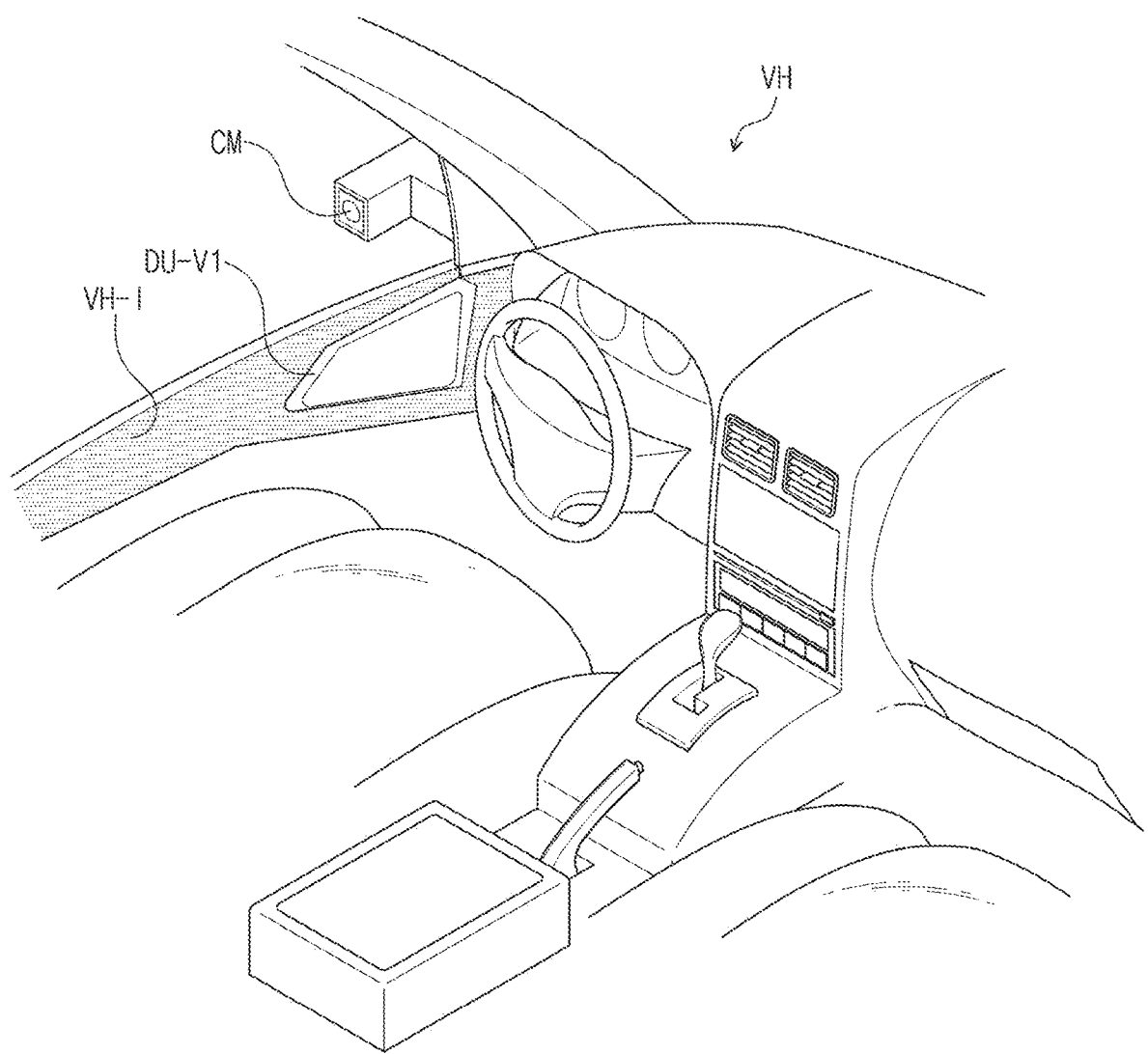
FIGS. 10A and 10B are perspective views illustrating an electronic apparatus according to an embodiment of the inventive concepts.
Figure 10B:
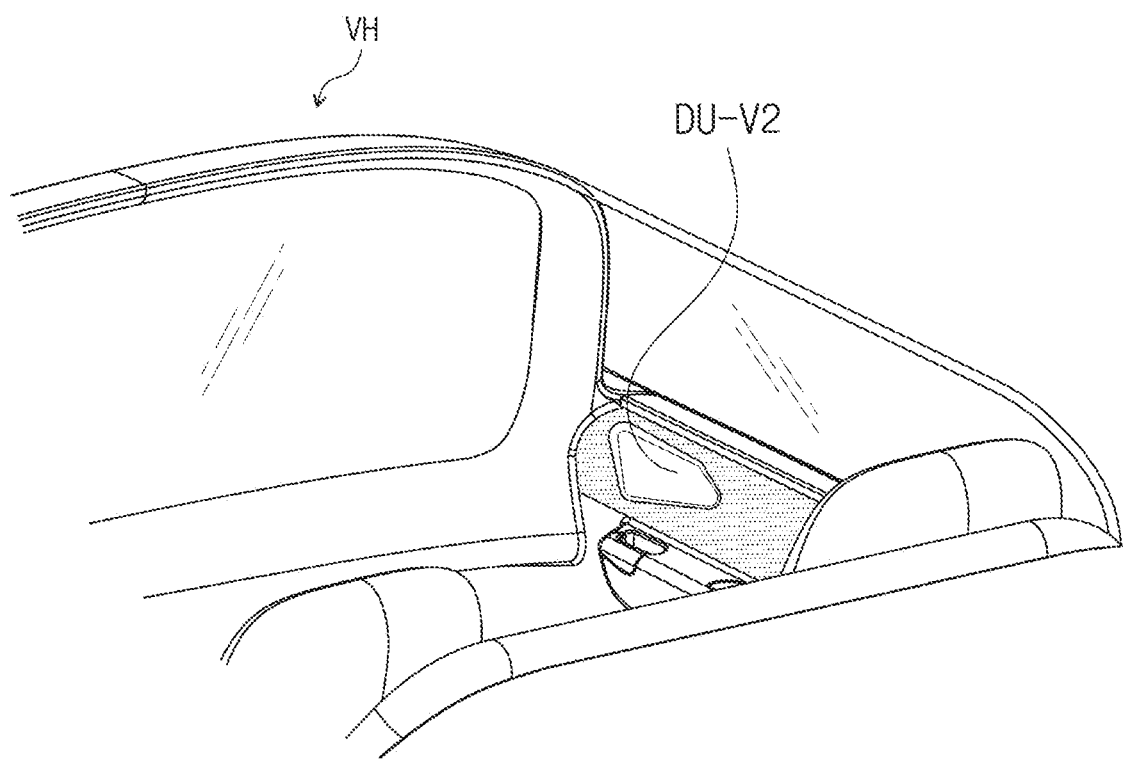

FIGS. 9A and 9B are perspective views illustrating a display unit according to an embodiment of the inventive concepts. FIGS. 10A and 10B are perspective views illustrating an electronic apparatus according to an embodiment of the inventive concepts. FIG. 9A is a perspective view showing a front surface of a display unit DU-V, and FIG. 9B is a perspective view showing a rear surface of the display unit DU-V. Hereinafter, embodiments of the inventive concepts will be described with reference to FIGS. 9A to 10B. Meanwhile, the same components as described with reference to FIGS. 1A to 8B will be indicated by the same reference designators, and the descriptions thereto will be omitted for the purpose of ease and convenience in description.

As illustrated in FIGS. 9A and 9B, the display unit DU-V may include a window WM-V and a display module DMC. The display module DMC may substantially correspond to the display module DM illustrated in FIG. 3A, and thus detailed descriptions thereto are omitted.

In some embodiments, the window WM-V may have a shape different from a rectangular shape. In the present embodiment, the display panel DP has a rectangular shape, and the window WM-V has a trapezoid shape of which corners are rounded.

A front surface IS-V of the window WM-V may include a transmission area TA and a bezel area BZA. In the present embodiment, edges of the transmission area TA may not be parallel to side surfaces of the window WM-V. A planar area of the bezel area BZA may be non-uniform along the edges of the transmission area TA.

In the present embodiment, protruding degrees of the side surfaces of the window WM-V from the display panel DP may not be equal to each other. Thus, a protrusion FF_R of the circuit board CB may protrude from the side surface of the window WM-V to the outside or be disposed inside the window WM-V, depending on a position of the circuit board CB and a position of the side surface of the window WM-V.

In some embodiments, the display unit DU-V may further include a cover panel film CVP, such that the protrusion FF_R of the circuit board CB protruding outside the display panel DP does not collide with the side surfaces of the window WM-V. Thus, it is possible to easily prevent a collision between the circuit board CB and the window WM-V provided in various shapes.

In FIGS. 10A and 10B, a vehicle is illustrated as an example of an electronic apparatus VH. The electronic apparatus VH may include a plurality of display units DU-V1 and DU-V2. Each of the display units DU-V1 and DU-V2 may correspond to the display unit DU-V illustrated in FIGS. 9A and 9B.

Each of the display units DU-V1 and DU-V2 may be disposed on an inner side VH-I of a door part of the electronic apparatus VH. In the present embodiment, the inner side VH-I of the door part is shaded for the purpose of ease and convenience in description and illustration. Each of the display units DU-V1 and DU-V2 may be inserted in the inner side VH-I of the door part.

An image obtained through a camera module CM of components of the electronic apparatus VH may be displayed on each of the display units DU-V1 and DU-V2 so as to be provided to a user (e.g., a driver). Thus, a component (e.g., a side mirror) disposed outward may be omitted, and information on the rear of the electronic apparatus VH may be easily visible to a user (or a driver) through the display units DU-V1 and DU-V2 disposed on the inner side VH-I of the door part.

In addition, according to the embodiments of the inventive concepts, the shape of the window WM-V may be variously modified or changed, and thus the display units DU-V1 and DU-V2 may be easily assembled to an irregular space (e.g., the inner side VH-I of the door part) without interference. As a result, process reliability of the display units DU-V1 and DU-V2 may be improved.

According to the embodiments of the inventive concepts, a collision between the circuit board and the window may be prevented in the assembly process, thus improving reliability of the display unit assembly process. In addition, assembly line workers may handle the display unit easily, thus simplifying the process. Furthermore, the electronic apparatus may be manufactured using the display unit with improved rework property, and thus reducing the process cost.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display unit, comprising:
    a display panel having a pad;
    a circuit board connected to the pad and bent from a front surface of the display panel toward a rear surface of the display panel;
    a window disposed on the front surface of the display panel to cover an active area; and
    a cover panel film disposed on the rear surface of the display panel and disposed between the display panel and the circuit board,
    wherein the cover panel film comprises:
        a first portion on the display panel; and
        a second portion extending from the first portion to protrude from the display panel when viewed in a plan view, and
    wherein the second portion is disposed between the circuit board and the window when viewed in a cross-sectional view.

2. The display unit of claim 1, wherein a planar area of the window is greater than a planar area of the display panel, and
    wherein one of side surfaces of the window, which overlaps with the second portion, protrudes from a side surface of the display panel when viewed in a plan view.

3. The display unit of claim 2, wherein at least a portion of the circuit board protrudes from the side surface of the display panel when viewed in a plan view, and
    wherein the second portion is disposed between the protruding portion of the circuit board and the window.

4. The display unit of claim 3, wherein the side surface of the display panel includes: a first side surface to which the circuit board is connected; a second side surface opposite to the first side surface; and a third side surface connecting the first side surface and the second side surface, and wherein the second portion of the cover panel film protrudes from same side as one of the second side surface and the third side surface of the display panel.

5. The display unit of claim 1, wherein the cover panel film further comprises:

an adhesive member disposed on the first portion, wherein the adhesive member does not overlap with the second portion when viewed in a plan view.

6. The display unit of claim 5, wherein the adhesive member is capable of repeated detaching and attaching.

7. The display unit of claim 1, wherein the circuit board comprises:

a flexible film;

a first lead-out pad disposed on the flexible film and connected to the pad; and a second lead-out pad disposed on the flexible film, spaced apart from the first lead-out pad, and electrically connected to the first lead-out pad, wherein the second lead-out pad is exposed from the second portion.

8. The display unit of claim 7, wherein a protrusion distance of the second portion from the first portion is less than a distance from an end of the second lead-out pads to a side surface of the display panel.

9. The display unit of claim 7, wherein the cover panel film is less flexible than the flexible film.

10. The display unit of claim 7, wherein the pad is arranged in a first direction, and wherein the first lead-out pad is facing the second lead-out pad in a second direction intersecting the first direction when viewed in a plan view.

11. The display unit of claim 10, wherein the second direction is perpendicular to the first direction.

12. The display unit of claim 10, wherein the second direction is a diagonal direction with respect to the first direction.

13. The display unit of claim 1, further comprising:

a protective panel disposed between the cover panel film and the display panel, wherein the protective panel includes at least one of a cushion member, a heat dissipation member, or a light blocking member.

14. The display unit of claim 1, wherein the first portion partially overlaps with the rear surface of the display panel.

* * * * *